(12) United States Patent
Park et al.

(10) Patent No.: US 9,069,383 B2
(45) Date of Patent: Jun. 30, 2015

(54) HAPTIC FEEDBACK DEVICE AND PORTABLE ELECTRONIC DEVICE

(75) Inventors: Dong Sun Park, Seoul (KR); Jae Kyung Kim, Gyunggi-do (KR); Dae Woong Yun, Incheon (KR); Yeon Ho Son, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/620,426

(22) Filed: Sep. 14, 2012

(65) Prior Publication Data

US 2013/0093577 A1    Apr. 18, 2013

(30) Foreign Application Priority Data

Oct. 18, 2011   (KR) .................... 10-2011-0106319

(51) Int. Cl.
| | |
|---|---|
| *H04B 3/36* | (2006.01) |
| *G08B 6/00* | (2006.01) |
| *H02N 2/00* | (2006.01) |
| *G06F 3/041* | (2006.01) |
| *G06F 3/033* | (2013.01) |
| *G06F 3/01* | (2006.01) |

(Continued)

(52) U.S. Cl.
CPC ................ *G06F 3/016* (2013.01); *G06F 3/041* (2013.01); *G06F 3/0416* (2013.01); *H01L 41/09* (2013.01); *G06F 3/03547* (2013.01); *H01L 41/0933* (2013.01)

(58) Field of Classification Search
CPC ....... G06F 3/016; G06F 3/041; G06F 1/1626; G06F 3/0414; G06F 3/03547; G06F 2203/014; G06F 3/04883; G08B 6/00; H01L 41/0906; H01L 41/09; H02N 2/005; H02N 2/0055
USPC .......... 340/407.1, 407.2, 4.12, 965, 566, 582; 345/177, 173, 156, 184, 701, 712, 856, 345/179; 310/348, 321, 367, 326, 317; 361/679.19
See application file for complete search history.

(56) References Cited

U.S. PATENT DOCUMENTS

| | | | | |
|---|---|---|---|---|
| 7,663,604 | B2 * | 2/2010 | Maruyama et al. | ........... 345/173 |
| 2004/0075676 | A1 * | 4/2004 | Rosenberg et al. | ........... 345/701 |
| 2004/0110527 | A1 | 6/2004 | Tierling et al. | |

(Continued)

FOREIGN PATENT DOCUMENTS

| | | |
|---|---|---|
| CN | 1578537 A | 2/2005 |
| KR | 2005-0012126 A | 1/2005 |

(Continued)

OTHER PUBLICATIONS

Korean Office Action for Application No. 10-2011-0106319 dated Apr. 22, 2013.

(Continued)

*Primary Examiner* — Mirza Alam
(74) *Attorney, Agent, or Firm* — McDermott Will & Emery LLP (57) ABSTRACT

There is provided a haptic feedback device. The haptic feedback device may include a case, a vibration member installed in the case, to vibrate, a vibration element formed in the vibration member, to generate vibrations, and a first impact absorbing member preventing a collision between the vibration member and the case.

14 Claims, 4 Drawing Sheets

(51) Int. Cl.
*H01L 41/09* (2006.01)
*G06F 3/0354* (2013.01)

(56) References Cited

U.S. PATENT DOCUMENTS

| | | |
|---|---|---|
| 2005/0023937 A1 | 2/2005 | Sashida et al. |
| 2006/0119586 A1* | 6/2006 | Grant et al. .................. 345/173 |
| 2006/0181522 A1* | 8/2006 | Nishimura et al. ........... 345/177 |
| 2007/0013270 A1* | 1/2007 | Sashida et al. ............... 310/348 |
| 2007/0080951 A1* | 4/2007 | Maruyama et al. ........... 345/173 |
| 2007/0236450 A1* | 10/2007 | Colgate et al. ............... 345/156 |
| 2008/0062122 A1 | 3/2008 | Rosenberg et al. |
| 2009/0189873 A1 | 7/2009 | Peterson et al. |
| 2009/0284485 A1* | 11/2009 | Colgate et al. ............... 345/173 |
| 2010/0188327 A1* | 7/2010 | Frid et al. ..................... 345/156 |
| 2011/0138277 A1* | 6/2011 | Grant et al. .................. 715/702 |

FOREIGN PATENT DOCUMENTS

| | | |
|---|---|---|
| KR | 10-1044208 B1 | 6/2011 |
| KR | 101046017 B1 | 7/2011 |
| KR | 10-2011-0094722 A | 8/2011 |
| WO | 2010/085575 A1 | 7/2010 |
| WO | 2011/054384 A1 | 5/2011 |

OTHER PUBLICATIONS

Chinese First Notification of Office Action issued in counterpart Chinese Patent Application No. 201210007556.4 on Mar. 2, 2015; 21 pages with English translation.

* cited by examiner

HAPTIC FEEDBACK DEVICE AND PORTABLE ELECTRONIC DEVICE

CROSS-REFERENCE TO RELATED APPLICATIONS

This application claims the priority of Korean Patent Application No. 10-2011-0106319 filed on Oct. 18, 2011, In the Korean Intellectual Property Office, the disclosure of which is incorporated herein by reference.

BACKGROUND OF THE INVENTION

1. Field of the Invention

The present invention relates to a haptic feedback device and a portable electronic device, and more particularly, to a haptic feedback device which may prevent deformation of and damage to a plate member due to an external impact, and a portable electronic device including the same.

2. Description of the Related Art

An input/output vibratory feedback mechanism (for example, a haptic feedback device) for a touch input scheme in which selection icons are displayed on a screen to improve user convenience has become widespread.

The haptic feedback device is a mechanism in which, when a user directly inputs a signal to a screen using a finger or the like, vibratory feedback is provided.

In using the haptic feedback device, space saving may be achieved, improvements in device operability and simplicity may be realized, and a user may easily recognize successful input. In addition, the haptic feedback device has excellent interfunctionality properties with IT devices. Accordingly, the haptic feedback device has been widely used as a guide device informing a user of a location in a public place (for example, a train station, a hospital, a school, or the like).

Meanwhile, the haptic feedback device is used as a means for notifying whether an input signal has been received or an output signal has been output. The haptic feedback device includes a vibration member (for example, a piezoelectric element) and a vibration plate that is vibrated thereby.

However, since the vibration plate included in the haptic feedback device is formed of a thin plate member to improve vibration characteristics, the haptic feedback device may be easily deformed or damaged in the case that an impact is transferred to the haptic feedback device (for example, when a user drops a device containing the haptic feedback device).

SUMMARY OF THE INVENTION

An aspect of the present invention provides a portable electronic device and a haptic feedback device which may significantly reduce damage or deformation of a vibration member thereof, due to an external impact such as dropping of the device.

According to an aspect of the present invention, there is provided a haptic feedback device, including: a case; a vibration member installed in the case, to vibrate; a vibration element formed in the vibration member, to generate vibrations; and a first impact absorbing member preventing a collision between the vibration member and the case.

The first impact absorbing member may be formed in the vibration member.

The first impact absorbing member may be formed in the case.

The first impact absorbing member may be formed in a position corresponding to the vibration element.

The first impact absorbing member may be respectively formed in the vibration member and in the case.

The first impact absorbing member may be formed of a compound including a silicon rubber component.

The first impact absorbing member may be formed of a single-component substance, for example, the silicon rubber component.

The haptic feedback device may further include a mass member attached to the vibration member.

The haptic feedback device may further include a second impact absorbing member attached to the mass member to prevent a collision between the mass member and the case.

The second impact absorbing member may be formed of a compound including the silicon rubber component.

The vibration element may be formed on a first surface of the vibration member, and the mass member may be formed on a second surface of the vibration member.

The vibration member may include a first plate member, both ends of which are fixed to the case, and to which the vibration element is attached and fixed, and a second plate member extended from the first plate member and receiving the mass member.

The second plate member may be extended from a side surface of the first plate member, and bent in a direction perpendicular to a plane of the first plate member.

The first plate member and the second plate member may be integrally formed in a pressing process.

According to another aspect of the present invention, there is provided a portable electronic device including the haptic feedback device described above.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings.

In the following description of the invention, terms referring to components of the invention are used with consideration to functions of the respective components, and thus will not be understood as limiting technical components of the invention.

Figure 1:
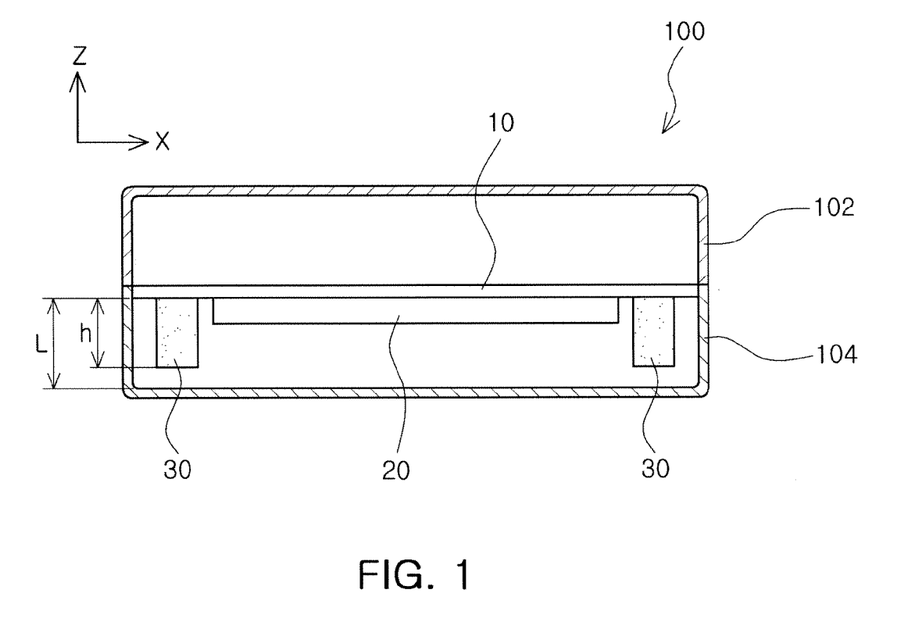
FIG. 1 is a schematic diagram illustrating a haptic feedback device according to a first embodiment of the present invention.
Figure 2:
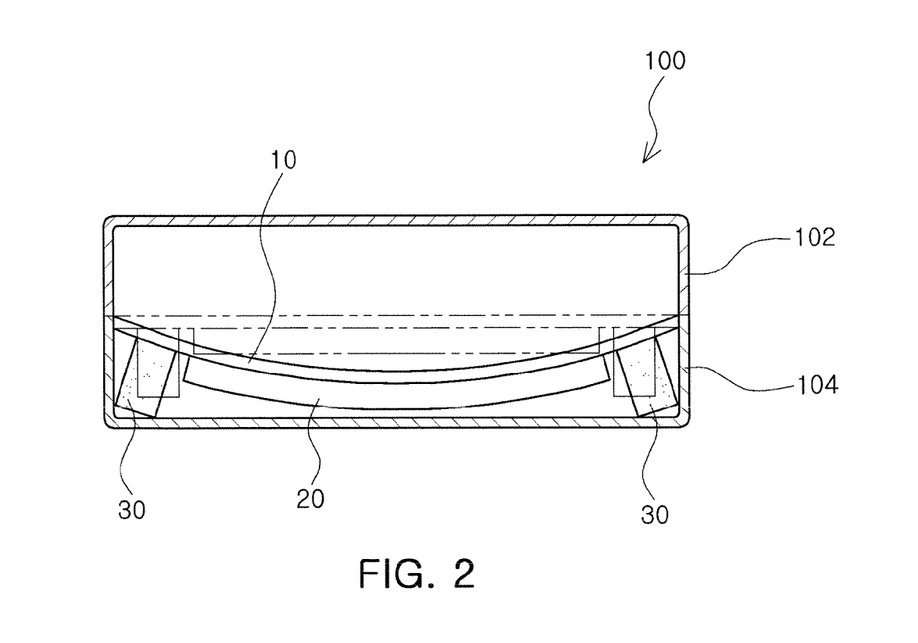
FIG. 2 is a schematic diagram illustrating a state in which impact is transferred to the haptic feedback device of FIG. 1.
Figure 3:
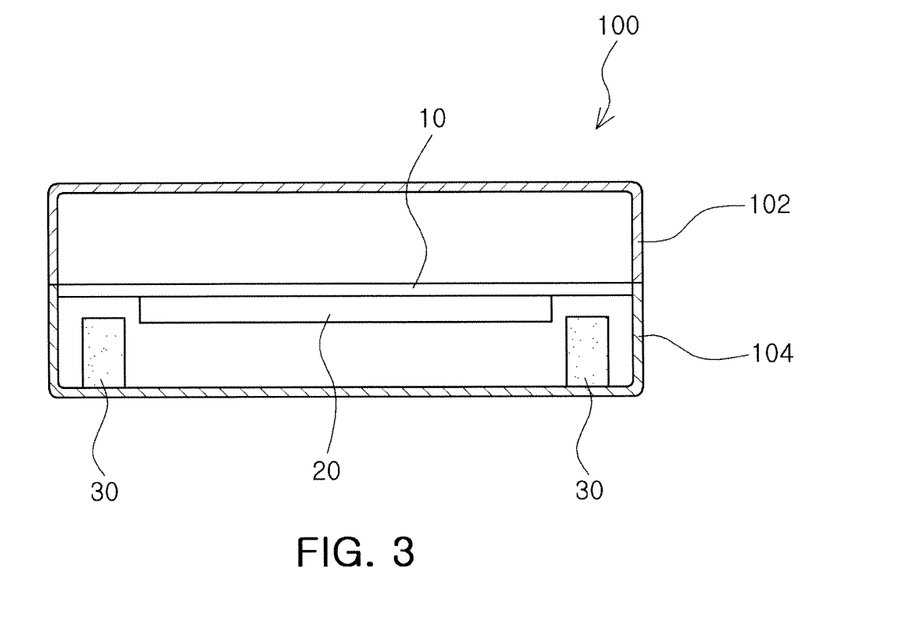
FIG. 3 is a schematic diagram illustrating a haptic feedback device according to a second embodiment of the present invention.
Figure 4:
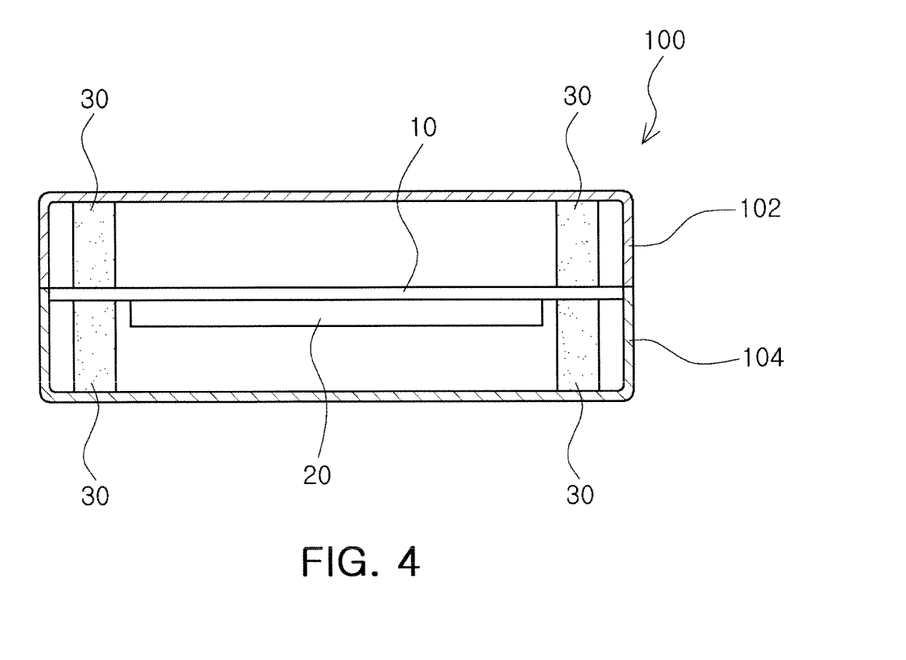
FIG. 4 is a schematic diagram illustrating a haptic feedback device according to a third embodiment of the present invention.
Figure 5:
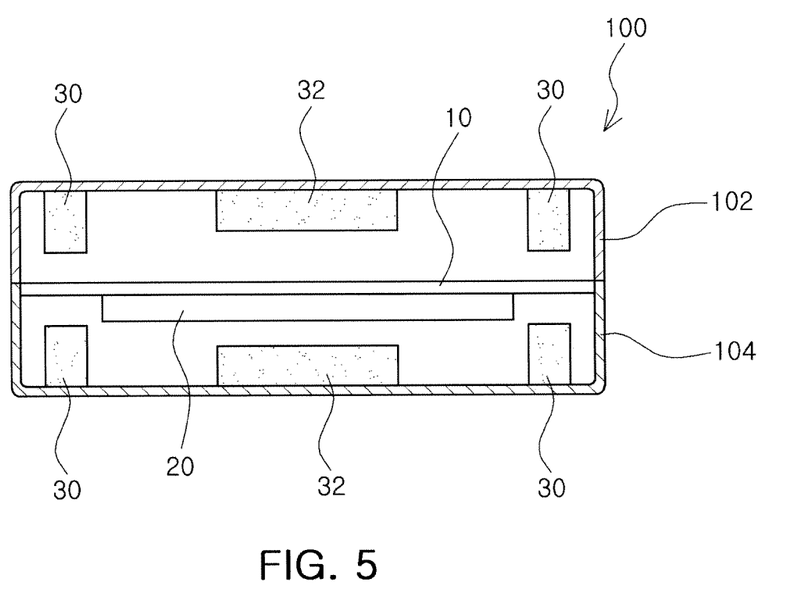
FIG. 5 is a schematic diagram illustrating a haptic feedback device according to a fourth embodiment of the present invention.
Figure 6:
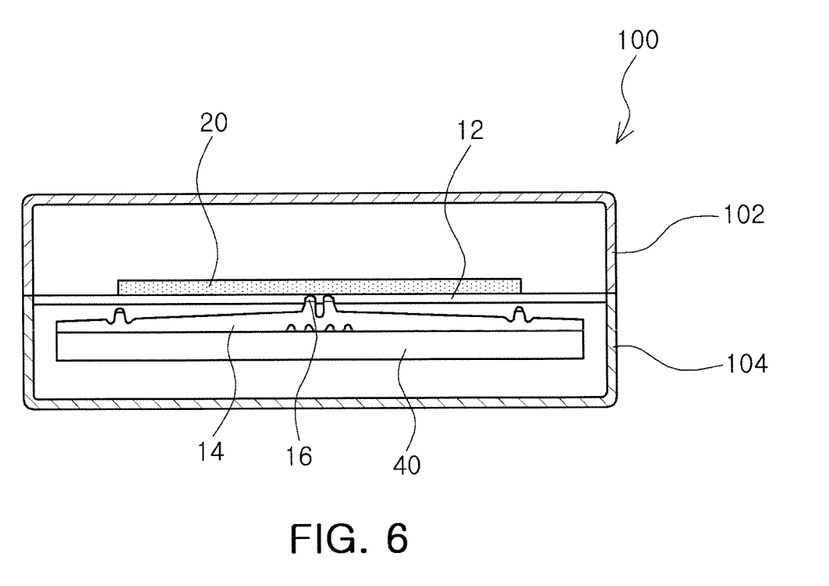
FIG. 6 is a schematic diagram illustrating a haptic feedback device according to a fifth embodiment of the present invention.
Figure 7:
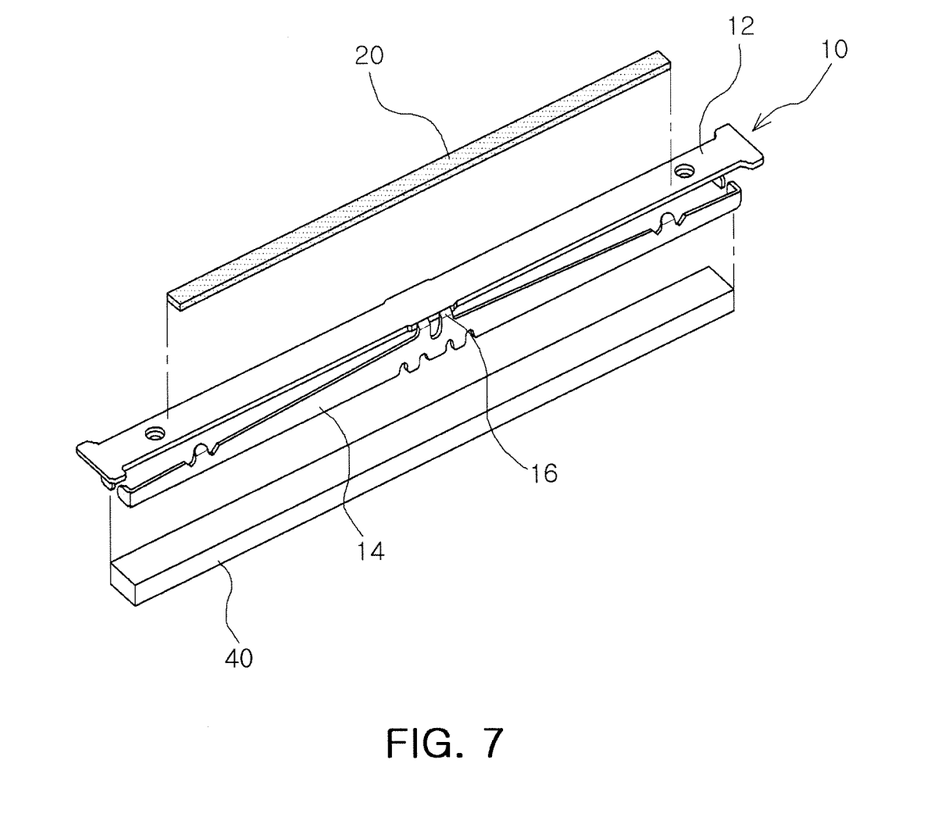
FIG. 7 is a schematic perspective diagram illustrating a vibration member for explaining a detailed structure of the vibration member of FIG. 6.

FIG. 1 is a schematic diagram illustrating a haptic feedback device according to a first embodiment of the present invention, FIG. 2 is a schematic diagram illustrating a state in which impact is transferred to the haptic feedback device of FIG. 1, FIG. 3 is a schematic diagram illustrating a haptic feedback device according to a second embodiment of the present invention, FIG. 4 is a schematic diagram illustrating a haptic feedback device according to a third embodiment of the present invention, FIG. 5 is a schematic diagram illustrating a haptic feedback device according to a fourth embodiment of the present invention, FIG. 6 is a schematic diagram illustrating a haptic feedback device according to a fifth embodiment of the present invention, and FIG. 7 is a schematic perspective diagram illustrating a vibration member for explaining a detailed structure of the vibration member of FIG. 6.

A haptic feedback device 100 according to a first embodiment of the present invention may include a case, that is, upper and lower cases 102 and 104, a vibration member 10, a vibration element 20 and a first impact absorbing member 30. The haptic feedback device 100 configured as above may be mounted in a portable electronic device such as a portable telephone, a portable electronic dictionary or the like.

Also, the haptic feedback device 100 may be connected to an input/output device of a corresponding electronic device to transmit vibration signals to a user. However, the haptic feedback device 100 of the present invention is not limited to being used in portable electronic devices, and may be installed in an automatic teller machine (ATM) including a touch screen, a route guidance system provided in a subway station, or the like. In addition, the haptic feedback device 100 may be mounted in other electronic devices requiring vibration signals to be output.

The cases 102 and 104 may be an upper case 102 and a lower case 104. The cases 102 and 104 may protect the haptic feedback device 100 from external impact. For this, the cases 102 and 104 may be formed of an impact-resistant metallic material.

However, to reduce the weight of the haptic feedback device 100, the cases 102 and 104 may be formed of a plastic material. In this case, the plastic material may include an impact resistant component.

The cases 102 and 104 may be mounted to be detachable from or attachable to an electronic device in which the haptic feedback device 100 is mounted. Otherwise, at least one (i.e. the upper case 102 or the lower case 104) of the cases 102 and 104 may be integrally formed with the portable electronic device (for example, a portable telephone) in which the haptic feedback device 100 is mounted. Otherwise, the upper case 102 or the lower case 104, or the upper case 102 and the lower case 104 may be a part of the portable electronic device.

In addition, the cases 102 and 104 may include an electrode for receiving electrical signals from the portable electronic device. The electrode may be formed outside the cases 102 and 104, and may provide a current to a vibration element 20 mounted inside the cases 102 and 104.

Meanwhile, the upper case 102 and the lower case 104 may be detachable from or attachable to each other. For example, the upper case 102 and the lower case 104 may be coupled to each other by a nut and bolt. Alternatively, the upper case 102 and the lower case 104 may be coupled by a separate fitting structure (for example, a protrusion and a groove).

The vibration member 10 may be manufactured to have a thin plate shape having a generally rectangular cross-section. However, the vibration member 10 may be manufactured to have a shape other than a rectangular shape, as long as the shape enables vertical vibrations.

The vibration member 10 may be formed of a material having a predetermined level of elasticity. For example, the vibration member 10 may be formed of a material such as a metal, a plastic, and the like. In addition, in the vibration member 10, a spring constant K may be determined so that the haptic feedback device 100 has a vibration frequency (100 to 300 Hz) within a predetermined range. For example, a length and a thickness of the vibration member 10 may be adjusted so that the haptic feedback device 100 has a vibration frequency of 100 Hz to 300 Hz.

The vibration member 10 may be fixed to the cases 102 and 104. Specifically, both ends of the vibration member 10 may be coupled with the cases 102 and 104. More specifically, both ends of the vibration member 10 may be fixed to the upper case 102 or the lower case 104, and simultaneously fixed to the upper case 102 and the lower case 104.

Here, both ends of the vibration member 10 may be coupled with the cases 102 and 104 by a welding method or a bolt fastening method. However, a coupling method between the vibration member 10 and the cases 102 and 104 is not limited to the above described method, and may be changed within a range which can be recognized by the person skilled in the art.

Since the vibration member 10 mounted in the above described cases 102 and 104 has predetermined level of elasticity as described above, the vibration member 10 may be vibrated in a vertical direction (in a Z-axis direction in FIG. 1) by an external force.

Here, the vibration member 10 may be contracted or extended for smooth vibration in a vertical direction. However, a magnitude of the contraction or the extension may not be outside of a range of elastic deformation of a material of the vibration member 10.

The vibration element 20 may be fixed to the vibration member 10. Specifically, the vibration element 20 may be attached to the vibration member 10 by an adhesive. Here, the adhesive may be an epoxy resin material, or a UV curable resin material. In addition, the vibration element 20 may be fixed to the vibration member 10 in a mechanical structure. For this, a receiving groove into which the vibration element 20 is inserted may be formed in the vibration member 10. Also, a protrusion for fixing a position of the vibration element 20 may be formed in the vibration member 10.

The vibration element 20 may be a piezoelectric element in which contraction and extension can be arbitrarily performed in accordance with electrical signals. For example, the vibration element 20 may be formed of PZT (Lead Zirconium Titanite Ceramic).

The above described vibration element 20 may be contracted and extended in accordance with the electrical signals to generate vibrations in the vibration member 10.

The vibration element 20 may be formed long in a longitudinal direction of the vibration member 10. Specifically, the vibration element 20 may be disposed in the center of the vibration member 10 so as not to affect vertical vibrations of the vibration member 10. In addition, a length of the vibration element 20 may be shorter than that of the vibration member 10.

The first impact absorbing member 30 may be attached to the vibration member 10. However, the attachment position of the first impact absorbing member 30 may not be limited to that shown in FIG. 1, and may be attached to the lower case 104 as shown in FIG. 3 (a second embodiment). In addition, the first impact absorbing member 30 may be attached to both the upper case 102 and the lower case 104 as shown in FIG. 4 (a third embodiment).

Meanwhile, the first impact absorbing member 30 may be positioned on both ends of the vibration member 10. The position of the first impact absorbing member 30 may effectively reduce impacts transferred to the haptic feedback device 100.

That is, when an external force is applied to the haptic feedback device 100, the external force may be transferred through connection points between the vibration member 10 and the cases 102 and 104. Accordingly, a portion in which the vibration member 10 is fixed may be vulnerable to impact. In the present embodiment, taking this point into consideration, the first impact absorbing member 30 may be formed in both ends (that is, the connection points between the vibration member 10 and the cases 102 and 104) of the vibration member 10.

However, the position of the first impact absorbing member 30 is not limited to the position shown in FIG. 1. For example, the first impact absorbing member 30 may be positioned in the center of the vibration member 10.

The first impact absorbing member 30 may be formed of a material that can be deformed by an external force. For example, the first impact absorbing member 30 may be formed of a foam resin or rubber material or a PORON®. Specifically, the first impact absorbing member 30 may be formed of a compound including a silicon rubber component, or formed of a single-component material, for example, silicon rubber.

The first impact absorbing member 30 may reduce external force transferred through the cases 102 and 104. In addition, the first impact absorbing member 30 may prevent a collision between the vibration member 10 and the cases 102 and 104 when the vibration member 10 is excessively vibrated by drop impact (see FIG. 2).

In particular, the first impact absorbing member 30 may significantly reduce a change in a vibration frequency of the haptic feedback device 100 after an impact is transferred to the haptic feedback device 100.

That is, a typical haptic feedback device 100 may have a vibration frequency of 100 Hz to 300 Hz. More specifically, the haptic feedback device 100 may effectively transmit a vibration signal to a user when having a vibration frequency of 200 Hz to 230 Hz.

However, when a large impact is transferred to the haptic feedback device 100 (for example, when a portable electronic device in which the haptic feedback device 100 is mounted is dropped by a user), the vibration member 10 of the haptic feedback device 100 may be deformed while colliding with the cases 102 and 104. However, the deformation of the vibration member 10 changes the vibration frequency of the haptic feedback device 100, so that transmission capability thereof may be degraded.

However, the haptic feedback device 100 according to the present embodiment includes the first impact absorbing member 30, so that the deformation of the vibration member 10 and the change in the vibration frequency of the haptic feedback device 100 due to the deformation of the vibration member 10 may be effectively prevented.

Table 1 indicates comparison results of the vibration frequencies (that is, resonant frequencies) before and after performing an impact experiment on the haptic feedback device 100. For reference, in experimental examples, silicon rubber was used as the first impact absorbing member 30.

TABLE 1

| Note | Resonant frequency (Hz) before dropping | Resonant frequency (Hz) after dropping |
| --- | --- | --- |
| Experimental example 1 | 221 | 225.5 |
| Experimental example 2 | 219 | 221.5 |
| Experimental example 3 | 223 | 229 |
| Experimental example 4 | 215 | 217 |

As shown in Table 1, a vibration frequency of the haptic feedback device 100 before dropping was 215 Hz to 223 Hz, and a vibration frequency of the haptic feedback device 100 after dropping was 217 Hz to 229 Hz.

That is, the vibration frequency of the haptic feedback device 100 slightly rose after dropping in comparison with vibration frequency of the haptic feedback device 100 before dropping. However, in the haptic feedback device 100 according to the present embodiment, the first impact absorbing member 30 significantly reduce deformation of the vibration member 10, so that a rising breadth of the vibration frequency is not large in comparison with the haptic feedback device which does not include the first impact absorbing member 30.

For reference, the vibration frequency of the haptic feedback device 100, which does not include the first impact absorbing member 30, after dropping, deviates significantly from a recommended vibration frequency range (200 Hz to 300 Hz).

Meanwhile, in the present embodiment, the first impact absorbing member 30 is attached to the vibration member 10, so that the vibration frequency of the vibration member 10 may be reduced. That is, since the first impact absorbing member 30 has a small amount of mass, M is actually increased as shown in Equation 1.

Accordingly, in the present embodiment, the first impact absorbing member 30 is attached to the vibration member 10, so that impact transferred to the vibration member 10 may be reduced, and at the same time, the vibration frequency of the haptic feedback device 100 may be lowered.

$$f = 2\pi\sqrt{\frac{k}{M}}$$ [Equation 1]

Here, K denotes a spring constant of the vibration member, and M denotes a mass of a vibration target (including the vibration member and the vibration element).

For reference, a length (h) of the first impact absorbing member 30 may be equal to or smaller than a distance (L) from a bottom surface of the lowercase 104 to a lower surface of the vibration member 10. In addition, the length (h) of the first impact absorbing member 30 may differ in accordance with a vibration breadth of the vibration member 10.

Hereinafter, other embodiments of the present invention will be described.

A second embodiment and a third embodiment of the present invention will be described with reference to FIGS. 3 and 4.

The haptic feedback device 100 according to the second embodiment may be different from that of the first embodiment in that the first impact absorbing member 30 is attached to the lower case 104.

In the haptic feedback device 100 configured as above, attachment and fixation of the first impact absorbing member 30 may be facilitated.

That is, in the present embodiment, the lower case 104 and the first impact absorbing member 30 may be molded in an insert injection molding method, so that the binding force between the lower case 104 and the first impact absorbing member 30 may be enhanced.

As a result, according to the present embodiment, a phenomenon in which the first impact absorbing member 30 is separated from the lower case 104 by frequent collisions between the vibration member 10 and the first impact absorbing member 30 may be significantly reduced.

In the haptic feedback device 100 according to the third embodiment, the first impact absorbing member 30 may be formed in each of the upper case 102 and the lower case 104. In addition, the first impact absorbing member 30 may be extended lengthwise towards the vibration member 10 from the upper case 102 and the lower case 104 to thereby be brought into contact with the vibration member 10.

In the haptic feedback device 100 configured as above, the first impact absorbing member 30 is formed in both the upper case 102 and the lower case 104, so that excessive vibrations of the vibration member 10 may be effectively suppressed.

Also, in the present embodiment, the first impact absorbing member 30 is disposed in a state of being brought into contact with the cases 102 and 104 and the vibration member 10, such that impacts transferred to the vibration member 10 may be effectively absorbed, and this impact energy may be transferred to the cases 102 and 104 to thereby be offset.

Accordingly, the present embodiment may be usefully applied to the haptic feedback device 100 which is sensitive to impact.

Hereinafter, the haptic feedback device according to a fourth embodiment of the present invention will be described with reference to FIG. 5.

The haptic feedback device 100 according to the fourth embodiment may further include a second impact absorbing member 32.

Typically, the vibration member 10 may be vibrated in a vertical direction (a Z-axis direction in FIG. 1) with respect to two connection points which are connected with the cases 102 and 104, so that the vibration member 10 may be easily brought into contact with the cases 102 and 104 in the center portion (a bisection point in a longitudinal direction of the vibration member 10).

In the present embodiment, taking this point into consideration, the second impact absorbing member 32 may be further formed in the cases 102 and 104. Here, the second impact absorbing member 32 may be formed in a position corresponding to a center portion of the vibration member 10 or a center portion of the vibration element 20.

For reference, the second impact absorbing member 32 may be attached to the cases 102 and 104 with an adhesive, similarly to the case of the first impact absorbing member 30, or may be integrally formed with the cases 102 and 104 in the insert injection molding method.

Hereinafter, the haptic feedback device 100 according to a fifth embodiment of the present invention will be described with reference to FIGS. 6 and 7.

The haptic feedback device 100 according to the fifth embodiment may be different from the above described embodiments in the shape of the vibration member 10, and further include a mass member 40.

In the present embodiment, the vibration member 10 may further include a first plate member 12 and a second plate member 14.

The first plate member 12 may be formed into a thin plate shape, and may be a vibration unit that is substantially vibrated in a vertical direction.

Both ends of the first plate member 12 may be fixed to the cases 102 and 104. The first plate member 12 may be formed of a material such as metal, plastic, or the like. Also, the first plate member 12 may have a predetermined spring constant K. Here, the spring constant K of the first plate member 12 may be determined within a range in which the haptic feedback device 100 has a vibration frequency of 100 Hz to 300 Hz.

In the first plate member 12, a fastening hole for fastening with the cases 102 and 104 may be formed. That is, the first plate member 12 may be fixed to the cases 102 and 104 through a fastening unit (a bolt, a pin, or the like).

In addition, the first plate member 12 may include a connection portion 16, connected with the second plate member 14. The connection portion 16 may be extended from both side surfaces of the first plate member 12, and may be formed in the vicinity of the bisection point in a longitudinal direction of the first plate member 12.

The second plate member 14 may be connected with the first plate member 12. Specifically, the second plate member 14 may be integrally formed with the first plate member 12 through the connection portion 16. More specifically, the second plate member 14 may be integrally formed with the first plate member 12 in a pressing process. The second plate member 14 formed as above may be bent in a direction perpendicular to the plane of the first plate member 12.

The second plate member 14 may have a predetermined mass so that the haptic feedback device 100 has a relatively low vibration frequency. Also, the second plate member 14 may be formed to have a shape which can receive the mass member 40 having the predetermined mass. For example, the second plate member 14 may be firmly coupled with the mass member 40 in a manner such that both ends of the second plate member 14 are bent in the same direction as shown in FIG. 7.

The mass member 40 may be coupled with the second plate member 14. Specifically, the mass member 40 may be fixed to the second plate member 14 in an inserted fitting manner, or may be attached to the second plate member 14 by an adhesive. The mass member 40 may have a predetermined mass, and lower the vibration frequency of the haptic feedback device 100 which is a vibration generator.

According to the present embodiment configured as above, since the mass member 40 may be further included through the second plate member 14, the vibration frequency of the haptic feedback device 100 may be easily adjusted through a change in the mass of the mass member 40.

As set forth above, according to the embodiments of the present invention, the impact absorbing member is disposed between the vibration member and the case, so that the vibration member may be effectively prevented from being excessively vibrated by impact.

While the present invention has been shown and described in connection with the embodiments, it will be apparent to those skilled in the art that modifications and variations can be made without departing from the spirit and scope of the invention as defined by the appended claims.

What is claimed is:

1. A haptic feedback device, comprising:
   a case;
   a vibration member disposed in the case and configured to vibrate;
   a vibration element disposed in the vibration member and configured to generate vibrations;
   a mass member attached to the vibration member;
   a first impact absorbing member configured to prevent a collision between the vibration member and the case when the vibration member is excessively vibrated by external force; and
   a second impact absorbing member attached to the mass member to prevent a collision between the mass member and the case,
   wherein both ends of the vibration member are directly fixed to the case such that the vibration member transmits the vibrations to the case, and the vibration element is disposed on a first surface of the vibration member, and the mass member is disposed directly on a second surface of the vibration member,
   wherein the first impact absorbing member is respectively disposed in the vibration member and in the case,
   wherein the vibration member includes a first plate member and a second plate member, and
   wherein the second plate member extends from a side surface of the first plate member, and is bent in a direction perpendicular to a plane of the first plate member.

2. The haptic feedback device of claim 1, wherein the first impact absorbing member is disposed in a position corresponding to the vibration element.

3. The haptic feedback device of claim 1, wherein the first impact absorbing member includes a compound including a silicon rubber component.

4. The haptic feedback device of claim 1, wherein the first impact absorbing member includes a single-component substance comprising a silicon rubber component.

5. The haptic feedback device of claim 1, wherein the second impact absorbing member includes a compound including a silicon rubber component.

6. The haptic feedback device of claim 1, wherein
   both ends of the first plate member are fixed in the case, the vibration element is attached and fixed to the first plate member, and
   the second plate member is configured to receive the mass member.

7. The haptic feedback device of claim 6, wherein the first plate member and the second plate member are integrally formed.

8. A portable electronic device comprising a haptic feedback device,
   the haptic feedback device, including:
   a case;
   a vibration member disposed in the case and configured to vibrate;
   a vibration element disposed in the vibration member and configured to generate vibrations;
   a mass member attached to the vibration member;
   a first impact absorbing member configured to prevent a collision between the vibration member and the case when the vibration member is excessively vibrated by external force; and
   a second impact absorbing member attached to the mass member to prevent a collision between the mass member and the case,
   wherein both ends of the vibration member are directly fixed to the case such that the vibration member transmits the vibrations to the case, and the vibration element is disposed on a first surface of the vibration member, and the mass member is disposed directly on a second surface of the vibration member,
   wherein the first impact absorbing member is respectively disposed in the vibration member and in the case,
   wherein the vibration member includes a first plate member, and a second plate member, and
   wherein the second plate member extends from a side surface of the first plate member, and is bent in a direction perpendicular to a plane of the first plate member.

9. The portable electronic device of claim 8, wherein the first impact absorbing member is disposed in a position corresponding to the vibration element.

10. The portable electronic device of claim 8, wherein the first impact absorbing member includes a compound including a silicon rubber component.

11. The portable electronic device of claim 8, wherein the first impact absorbing member includes a single-component substance comprising a silicon rubber component.

12. The portable electronic device of claim 8, wherein the second impact absorbing member includes a compound including a silicon rubber component.

13. The portable electronic device of claim 8, wherein
   both ends of the first plate member are fixed in the case, the vibration element is attached and fixed to the first plate member, and
   the second plate member is configured to receive the mass member.

14. The portable electronic device of claim 13, wherein the first plate member and the second plate member are integrally formed.

* * * * *